US00H002222H

(19) United States
(12) Statutory Invention Registration
Rangaswamy et al.

(10) Reg. No.: US H2222 H
(43) Published: Aug. 5, 2008

(54) NORMALIZED MATCHED FILTER—A LOW RANK APPROACH

(75) Inventors: Muralidhar Rangaswamy, Westborough, MA (US); Freeman Lin, Acton, MA (US)

(73) Assignee: The United States of America as represented by the Secretary of the Air Force, Washington, DC (US)

(21) Appl. No.: 11/251,007

(22) Filed: Oct. 13, 2005

(51) Int. Cl.
*H03D 1/00* (2006.01)
*G01S 13/534* (2006.01)

(52) U.S. Cl. ..... 342/159
(58) Field of Classification Search ..... 342/159
See application file for complete search history.

(56) References Cited

U.S. PATENT DOCUMENTS

| | | | | |
|---|---|---|---|---|
| 4,855,932 | A | | 8/1989 | Cangiani et al. |
| 5,168,215 | A | | 12/1992 | Puzzo |
| 5,272,698 | A | | 12/1993 | Champion |
| 5,499,030 | A | * | 3/1996 | Wicks et al. ..... 342/93 |
| 5,640,429 | A | | 6/1997 | Michels et al. |
| 6,091,361 | A | * | 7/2000 | Davis et al. ..... 342/378 |
| 6,226,321 | B1 | * | 5/2001 | Michels et al. ..... 375/227 |
| 6,266,321 | B1 | | 7/2001 | Pehkonen et al. |
| 6,771,723 | B1 | | 8/2004 | Davis et al. |

OTHER PUBLICATIONS

Michels et al. "Evaluation of the Normalized Parametric Adaptive Matched Filer STAP Test in Airborne Radar Clutter". The Record of the IEEE 2000 International Radar Conference, 2007. May 7–12, 2000. pp. 769–774.*

Michels et al. "Performance of STAP Tests in Compound–Gaussian Clutter". Proceedings of the 2000 IEEE Sensor Array and Multichannel Signal Processing Workshop. Mar. 16–17, 2000. pp. 250–255.*

Rangaswamy et al. "Low Rank Adaptive Signal Processing for Radar Applications". IEEE International Conference on Acoustics, Speech, and Signal Processing, 2004. May 17–21, 2004. vol. 2. pp. ii–201–204.*

* cited by examiner

*Primary Examiner*—Daniel Pihulic
(74) *Attorney, Agent, or Firm*—William G. Auton

(57) ABSTRACT

This invention addresses the problem of radar target detection in severely heterogeneous clutter environments. Specifically, we present the performance of the normalized matched filter test in a background of disturbance consisting of clutter having a covariance matrix with known structure and unknown scaling plus background white Gaussian noise. It is shown that when the clutter covariance matrix is low rank, the (LRNMF) test retains invariance with respect to the unknown scaling as well as the background noise level and has an approximately constant false alarm rate (CFAR). Therefore, a technique known as self-censoring reiterative fast maximum likelihood/adaptive power residue (SCRFML/APR) is developed to treat this problem and its performance is discussed. The SCRFML/AP method is used to estimate the unknown covariance matrix in the presence of outliers. This covariance matrix estimate can then be used in the LRNAMF or any other eigen-based adaptive processing technique.

5 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

$P_{ta}$ versus threshold

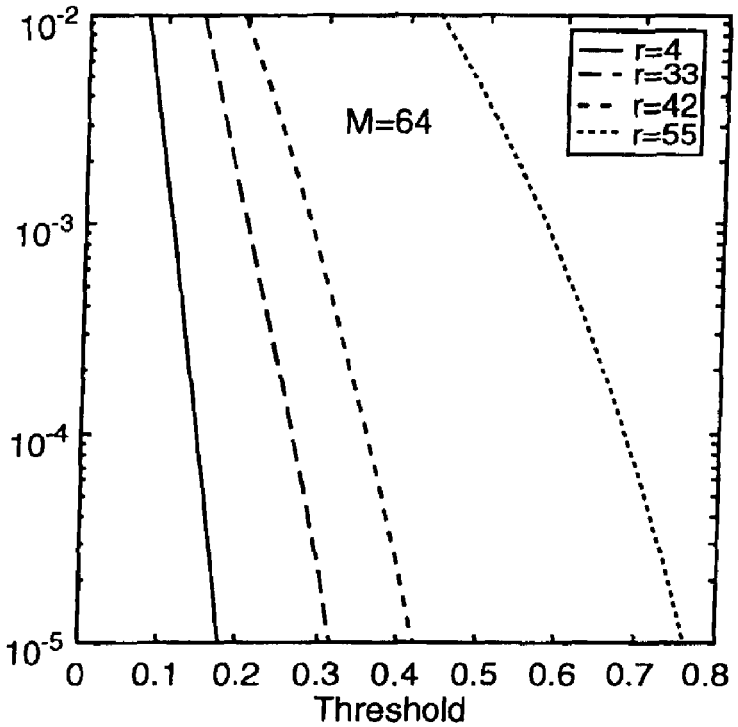
Fig. 2 $P_{ta}$ versus threshold
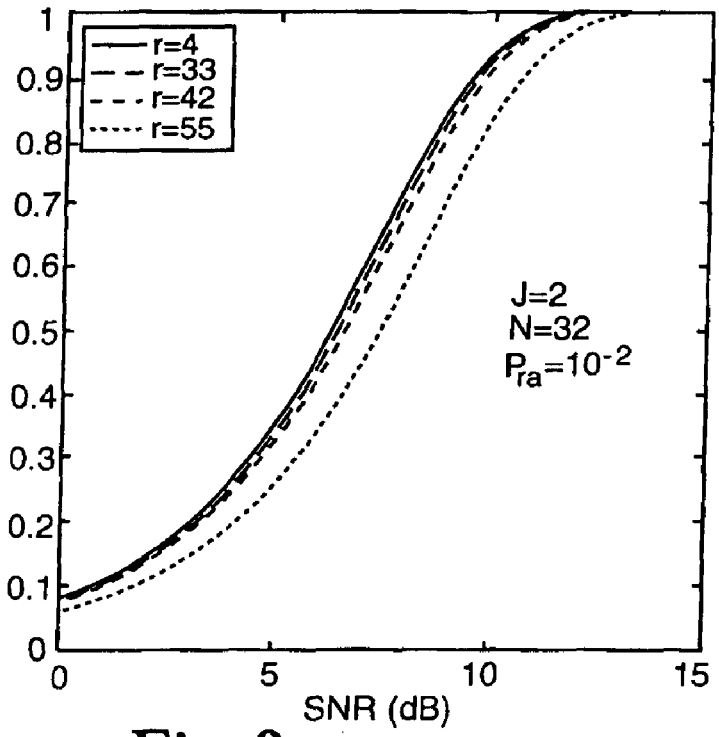
Fig. 3 $P_d$ versus SNR alarm probability

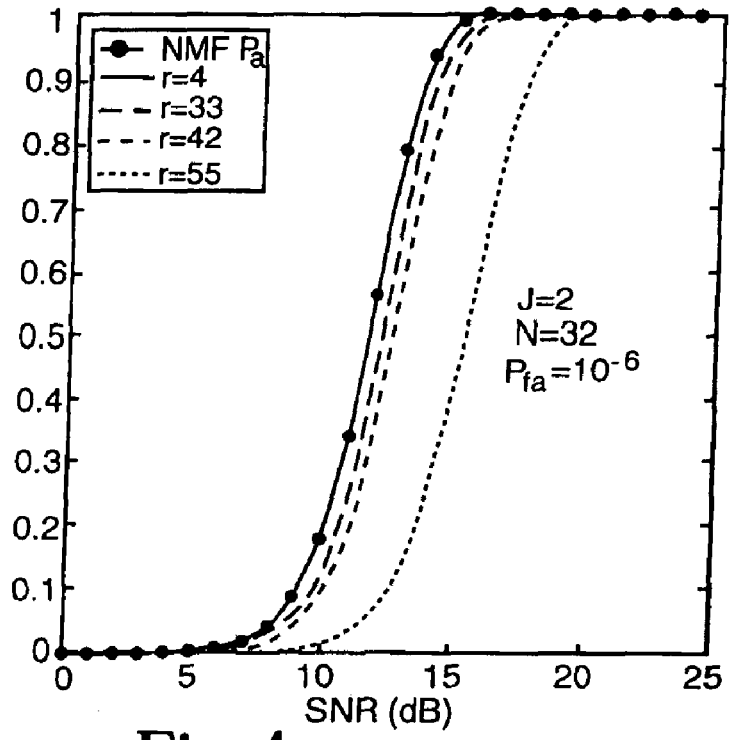
Fig. 4 $P_d$ versus SNR
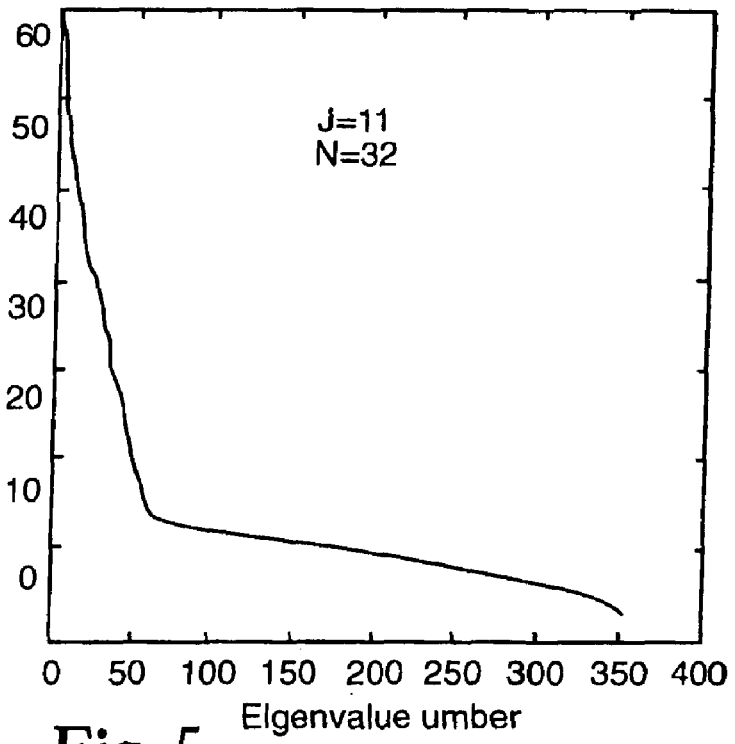
Fig. 5 Eigenspectrum of KASSPER data

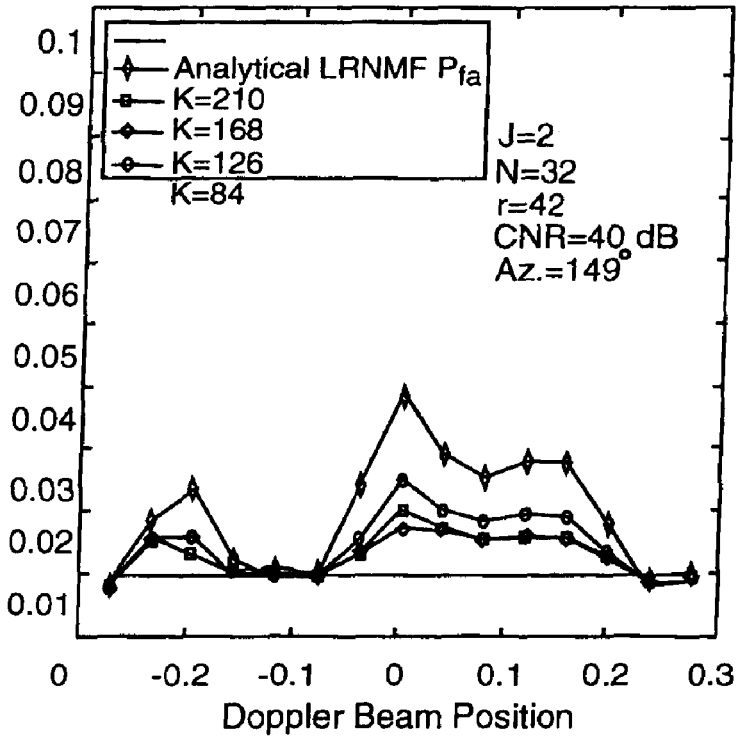
Fig. 6 $P_{fa}$ versus normalized Doppler beam position
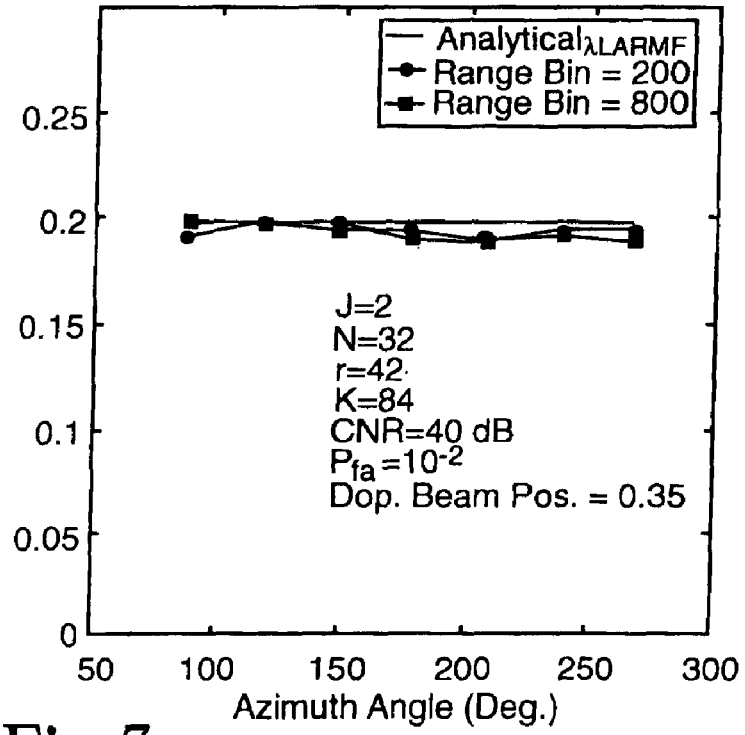
Fig. 7 Threshold versus angular beam position

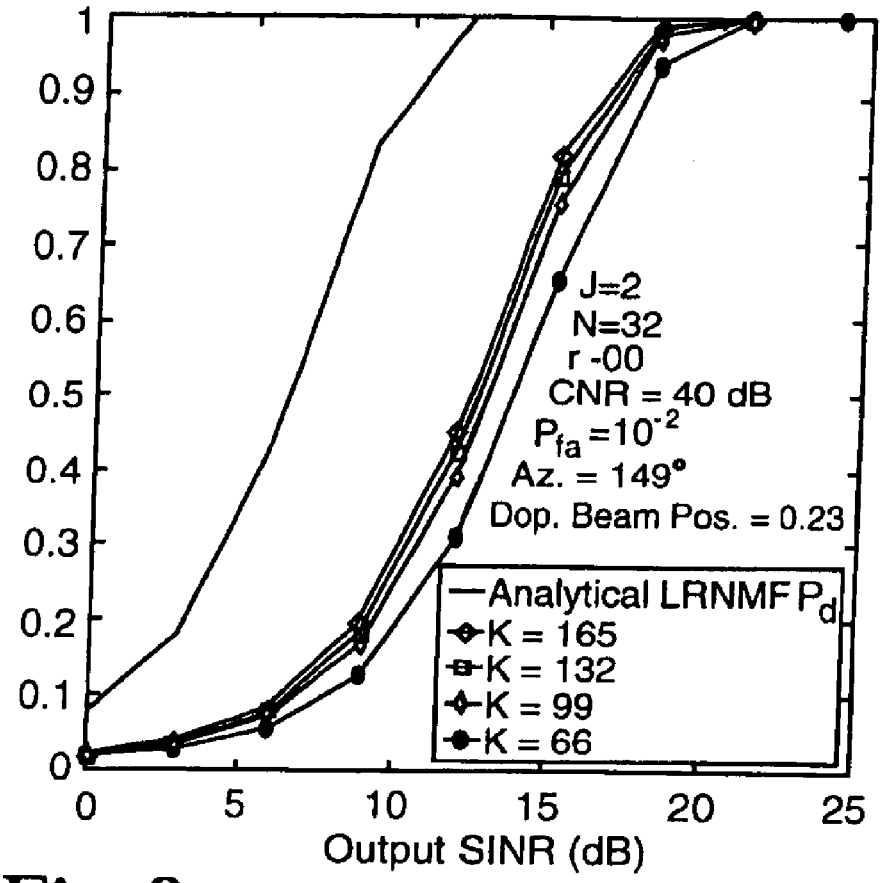
Fig. 8 $P_d$ versus SINR: mismatched clutter subspace

NORMALIZED MATCHED FILTER— A LOW RANK APPROACH

STATEMENT OF GOVERNMENT INTEREST

The invention described herein may be manufactured and used by or for the Government for governmental purposes without the payment of any royalty thereon.

BACKGROUND OF THE INVENTION

The invention relates generally to radar receivers, and more specifically, it relates to a low rank approximation to interference covariance for target detection in non-Gaussian clutter.

This invention addresses the problem of signal detection in interference composed of clutter (and possibly jamming), having a covariance matrix with known structure but unknown level and background white noise. The technique developed in this paper ensures invariance with respect to the unknown level and the background noise power. The research is motivated by the problem of space-time adaptive processing (STAP) for airborne phased-array radar applications. Typically, a radar receiver front end consists of an array of J antenna elements processing N pulses in a coherent processing interval. We are interested in the problem of target detection given the JN×1 spatio-temporal data vector.

Patented art of interest includes the following U.S. Patents, the disclosures of which are incorporated herein by reference:

U.S. Pat. No. 6,771,723 entitled Normalized parametric adaptive matched filter receiver issued to Davis U.S. Pat. No. 5,640,429 issued to Michels and Rangaswamy;

U.S. Pat. No. 5,272,698 issued to Champion;

U.S. Pat. No. 5,168,215 issued to Puzzo;

U.S. Pat. No. 4,855,932 issued to Cangiani; and

U.S. Pat. No. 6,266,321 issued to Michels, et al.

The Davis patent describes an apparatus and method for improving the detection of signals obscured by either correlated Gaussian or non-Gaussian noise plus additive white noise. Estimates from multichannel data of model parameters that described the noise disturbance correlation are obtained from data that contain signal-free data vectors, referred to as "secondary" or "reference" cell data. These parameters form the coefficients of a multichannel whitening filter. A data vector to be tested for the presence of a signal passes through the multichannel whitening filter. The filter output is then processed to form a test statistic.

Cangiani et al. disclose a three dimensional electro-optical tracker with a Kalman filter in which the target is modeled in space as the superposition of two Guassian ellipsoids projected onto an image plane. Puzzo offers a similar disclosure. Champion discloses a digital communication system.

Michels et al., U.S. Pat. No. 6,226,321, hereby incorporated by reference, discloses implementations, for a signal that has unknown amplitude. For the signal of unknown amplitude, Michels et al. teaches us how to incorporate the estimated signal amplitude directly into the parametric detection procedure. Furthermore, Michels teaches two separate methods, namely, (1) how to detect the signal in the presence of partially correlated non-Gaussian clutter disturbance and (2) how to detect the signal in the presence of partially correlated Gaussian clutter disturbance. Furthermore, the method to detect the signal in the presence of partially correlated non-Gaussian clutter involves processing the received radar data and requires the use of functional forms that depend upon the probability density function (pdf) of the disturbance. Thus, the latter method requires knowledge of the pdf statistics of the non-Gaussian disturbance. The method does not teach how to process the data in such a manner that would not require knowledge of the disturbance processes. Furthermore, it does not teach how to process the data with one method that would detect the signal in either Gaussian or non-Gaussian disturbance. Thus there exists a need for apparatus and method of processing the data with a detection method that does not require knowledge of the clutter statistics. Furthermore, there exists a need for a method that detects the signal in either Gaussian or non-Gaussian disturbance.

The performance improvements of the presently disclosed invention relative to prior art are detailed in J. H. Michels, M. Rangaswamy, and B. Himed, "Evaluation of the Normalized Parametric Adaptive Matched Filter STAP Test in Airborne Radar Clutter," IEEE Internationals Radar 2000 Conference, May 7–11, 2000 Washington, D.C. and J. H. Michels, M. Rangaswamy, and B. Himed, "Performance of STAP Tests in Compound-Gaussian Clutter," First IEEE Sensor Array and Multichannel Signal.

Previous efforts derived the normalized matched filter (NMF) test for the problem of detecting a rank one signal in additive clutter modeled as a spherically invariant random process. The NMF test is given by $$\Lambda_{NMF} = \frac{|e^H R_c^{-1} x|^2}{[e^H R_c^{-1} e][x^H R_c^{-1} x]} \underset{H_0}{\overset{H_1}{\gtrless}} \lambda_{NMF},$$

where x is the observed data vector, e is the known spatio-temporal signal steering vector, and Rc is the known clutter covariance matrix. A statistic similar in spirit was also considered in for vector subspace detection in compound-Gaussian clutter.

SUMMARY OF THE INVENTION

We developed a technique known as the low rank normalized matched filter (LRNMF) for radar target detection in disturbance composed of clutter and background white noise, having unknown but differing power levels. We show that the LRNMF test exhibits invariance with respect to the unknown clutter and noise power levels, when the clutter covariance matrix is low rank. Performance of the test is shown to be a function of the number of antenna array elements, number of pulses processed in a coherent processing interval (CPI) and the rank of the clutter covariance matrix, which can be determined from system parameters such as platform speed, inter-element spacing, and pulse repetition interval (PRI). Consequently, the technique offers a constant false alarm rate (CFAR) for the case where the clutter and noise covariance matrices have known structure and unknown scaling. An adaptive version of the test known as the low rank normalized adaptive matched filter (LRNAMF) is developed to address the problem of target detection when both the covariance structure and level for the clutter and noise are unknown. The LRNAMF performance is benchmarked in terms of the sample support needed for attaining detection performance to within 3 dB of the LRNMF. Issues of CFAR and clutter rank determination are also addressed. Performance analysis is carried out using data from the knowledge aided sensor signal processing and expert reasoning (KASSPER) Program.

DESCRIPTION OF THE DRAWINGS

FIG. 2 is a chart of the false versus threshold for the LRNMF test;

FIG. 3 is a chart of the probability of detection versus SNR alarm probability;

FIG. 4 is a chart of the probability of detection versus SNR

FIG. 5 is a chart of the Eigenspectrum of KASSPER data;

FIG. 6 is a chart of the Pfa versus normalized Doppler beam position

FIG. 7 is a chart of the threshold versus angular beam position; and

FIG. 8 Pd versus SINR.

DETAILED DESCRIPTION OF THE PREFERRED EMBODIMENT

Figure 1:
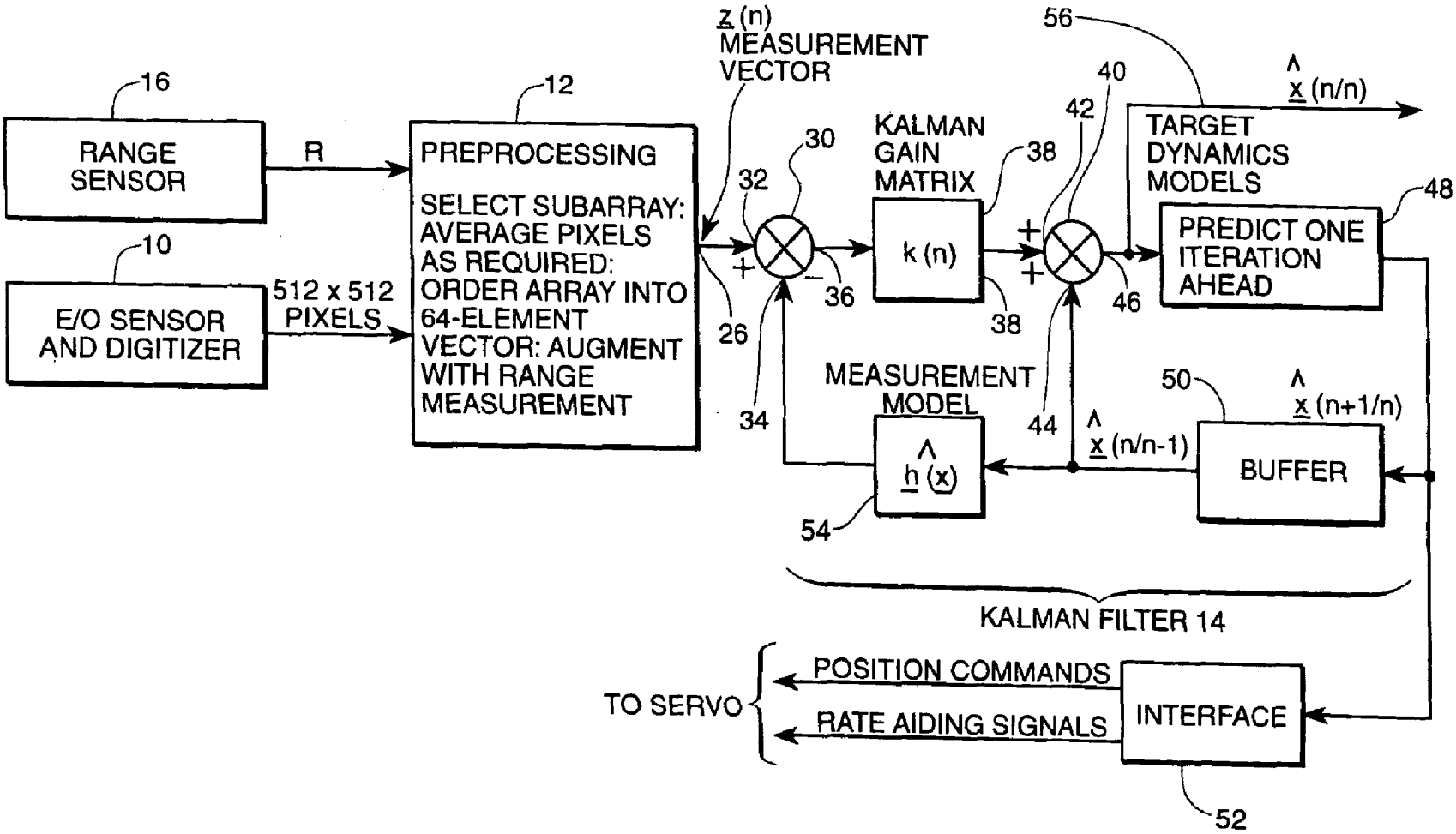
Fig. 1 PRIOR ART
FIG. 1 is an illustration of prior art electro-optical sensor system which uses a Kalman filter on a detected data stream.

The present invention includes a technique known as the low rank normalized matched filter (LRNMF) for radar target detection in disturbance composed of clutter and background white noise, having unknown but differing power levels.

This invention seeks to extend previous work by including the effect of additive white Gaussian noise. Specifically, we consider the binary hypothesis testing problem given by $$H_0: x=d=c+n,$$

$$H_1: x=ae+d=ae+c+n,$$

where x is the observed data vector, c denotes the Gaussian clutter vector having a covariance matrix sRc with known structure and unknown level s, n denotes the additive white Gaussian noise vector having covariance matrix $\sigma^2 I$, where I is the JN×JN identity matrix and $\sigma^2$ is the unknown noise power, e denotes the steering vector and a is the unknown complex amplitude of the target. For the sake of compactness, d is used to denote disturbance consisting of clutter plus white noise. Consequently, the disturbance covariance matrix is given by $Rd=sRc+\sigma^2 I$.

In order to understand the advantages of the present invention, the reader's attention is now directed towards FIG. 1, which is a block diagram of the prior art electro-optical tracker of the above-cited Cangiani et al patent that uses a Kalman filter 14 on the data measurement Z (n) of the sensors 10 and 16. In FIG. 1 the preprocessor 12 averages and orders the image data for the Kalman filter 14. However, there are situations where the image data is unaltered by the preprocessor 12. For example, where the entire image can be encompassed in the 8×8 window, no averaging occurs. The image data is not modified and the preprocessor 12 is in reality a pass-through. Therefore, the Kalman filter 14 in essence receives input directly from the electro-optical sensor 10 and the range sensor 16.

The output of the 56 Kalman filter 14 is taken from the output 46 of the second adder 40. The signal at that point is designated x(n/n). The carat indicates that this quantity is an estimate and the n/n indicates that the estimate is at time nT, given n measurements, where T is the time interval between interactions. The target dynamics estimate for time (n+1)T, which is designated x (n+1/n). The measurement model 54 processes the predicted state vector estimate from the result of previous iteration, x(n/n−1), which was stored in the buffer 50, generating h (x(n/n−1)), the estimate of the current measurement. This is subtracted from the measurement vector z(n) in the first adder 30, yielding the residual or innovations process, z(n)−h(x(n/n−1)). The residual is then multiplied by the Kalman gain matrix, K(n), and the result is used to update the state vector estimate, x(n). In each iteration, the state vector x is updated to an approximation of the actual position, velocity, and acceleration of the target.

The prior art invariable properties fail for the problem where the clutter power and noise variance are unknown and different from each other. This is due to the fact that invariance condition of requires a common unknown scaling on the clutter and background white noise—a condition that is seldom satisfied in practice. A uniformly most powerful invariant (UMPI) test for this problem becomes mathematically intractable in general. However, in many practical airborne radar applications Rc has rank r which is much less than the spatio-temporal product M=JN. For example, the clutter rank in the airborne linear phased array radar problem under ideal conditions (no mutual coupling between array elements), is given by the Brennan rule $$r=J+\gamma(N-1),$$

where $\gamma=2v_pT/d$ is the slope of the clutter ridge, with $v_p$ denoting the platform velocity, T denoting the pulse repetition interval, and d denoting the inter-element spacing. A nominal value of $\gamma=1$, yields a clutter rank $r\approx J+(N-1)<M$ especially for large J and N. This fact is advantageously used to obtain a test which offers invariance to the unknown clutter power and noise level.

Additionally, the low rank approximation enables reduction of training data support compared to full dimension STAP processing. An adaptive version of the test is also developed and its performance is studied. Target contamination of training data has a deleterious impact on the performance of the test. Therefore, a technique known as self-censoring reiterative fast maximum likelihood/adaptive power residue (SCRFML/APR) is developed to treat this problem and its performance is discussed. The SCRFML/APR method is used to estimate the unknown covariance matrix in the presence of outliers. This covariance matrix estimate can then be used in the low rank normalized adaptive matched filter (LRNAMF) or any other eigen-based adaptive processing technique. Now, we introduce the low-rank normalized matched filter (LRNM). Tiie performance of the LRNMF in terms of analytical calculation of false alarm probability ($P_{fa}$) and detection probability ($P_d$) discussed below introduces an adaptive version of the LRNMF known as the LRNAMF and discusses its performance with respect to CFAR, sample support for subspace estimation and detection.

The disturbance covariance matrix can be expressed as $R_d=UDU^H$, where U is the matrix whose columns are the normalized eigenvectors of $R_d$ and D is the diagonal matrix of eigenvalues of $R_d$. When $R_c$ has rank r<M, $R_d$ can be expressed as $$R_d = \sum_{i=1}^{r} (s\lambda_i + \sigma^2) u_i u_i^H + \sum_{i=r+1}^{N} \sigma^2 u_i u_i^H.$$

For $s\lambda_1>\sigma^2$, it follows from [20] that the inverse covariance matrix can be approximated as $$R_d^{-1} \approx \frac{1}{\sigma^2}(I-P),$$

where $P=E^r_{i=1} u_i u_i^H$ is a rank r projection matrix formed from the eigenvectors corresponding to the dominant eigenvalues of Rd. For Rc with known structure, the dominant modes are readily determined and are unaffected by s.

We now use the form of $R_d^{-1}$ given by (5) to express the LRNMF test as $$\Lambda_{lr} = \frac{|e^H(I-P)x|^2}{[e^H(I-P)e][x^H(I-P)x]} \underset{H_0}{\overset{H_1}{\gtrless}} \lambda_{lr}.$$

Observe that the LRNMF test is invariant to s and $\sigma^2$. Furthermore, let $e_1=(I-P)e$ and $x_1=(I-P)x$. Thus, the LRNMF test can be expressed as $$\Lambda_{lr} = \frac{|e_1^H x_1|^2}{[e_1^H e_1][x_1^H x_1]} \underset{H_0}{\overset{H_1}{\gtrless}} \lambda_{lr},$$

which allows for important interpretations of the test statistic as normalized matched filtering in the sub-dominant disturbance subspace or a dominant mode rejector followed by quadratic normalizations to ensure CFAR. It is helpful to note in this context that the low rank approximation to the clairvoyant RMB beamformer given by $$\Lambda_{LRRMB} = \frac{1}{\sigma^4}|e^H(I-P)x|^2 \underset{H_0}{\overset{H_1}{\gtrless}} \lambda_{LRRMB}$$

and the low rank approximation to the matched filter for rank one signal detection in Gaussian noise given by $$\Lambda_{MFLR} = \frac{1}{\sigma^2}\frac{|e^H(I-P)x|^2}{[e^H(I-P)e]} \underset{H_0}{\overset{H_1}{\gtrless}} \lambda_{MFLR}$$

incur an explicit dependence on $\sigma^2$. Consequently, they do not offer CFAR with respect to $\sigma^2$. The work of considered a test involving the numerator of the test statistic of (8) and its adaptive version. However, such a test incurs explicit dependence on $\sigma^2$. Therefore, it lacks CFAR. Consequently, performance analysis was presented in terms of the output signal-to-noise ratio (SNR), with elegant derivations for the output SNR probability density function (PDF). In this paper, we concern ourselves with the performance of the test of equation(6) and its adaptive version. We now consider the performance of the test of equation (6). Analytical expressions are derived for the probability of false alarm and probability of detection for the LRNMF. For convenience, we work with the test of the form of (7) to carry out the analysis. Noting that a unit vector in the direction of $e_1$ is given by $e_2=e_1=/e^H{}_1e_1$, $x^H{}_l\, x_1$ can be expressed as the sum of the squared magnitudes of projections along space of $e_2$ denoted by $\Psi_\perp$. Let $w_i$, i=1, 2, . . . , M−r−1 denote an orthonormal basis set for $\Psi_\perp$ and $X_0=e^H{}_2x_1$, $X_i=w^H{}_ix_1$, i=1,2, . . . , M−r−1. Then, $X_i$, i=0,1, . . . , M−r−1 are statistically independent complex-Gaussian random variables. Let $$\xi_1 = |X_0|^2/\sigma^2,\ \xi_2 = (1/\sigma^2)\sum_{i=1}^{M-r-1}|X_i|^2,\ \text{and}\ \Phi = \xi_1/\xi_2.$$

The test statistic of (7) admits a representation of the form $$\Lambda_{lr} = \frac{\Phi}{(1+\Phi)}.$$

Under $H_0$, $X_i$, i=1, . . . ,M−r−1 are complex-Gaussian random variables distributed as CN(0, $\sigma^2$).

Consequently, $\epsilon_2$ is a Chi-squared distributed random variable with (M−r−1) complex degrees-of-freedom. Also under $H_0$, $X_0$ is a complex-Gaussian random variable distributed as CN(0, $\sigma^2$). Hence, $\epsilon_1$ is a chi-squared distributed random variable with one complex degree-of-freedom. It follows from [1] that $\phi$ is a central-F distributed random variable, whose probability density function (PDF) is given by $$f_\Phi(\phi) = \frac{1}{\beta(1, M-r-1)}\frac{1}{(1+\phi)^{M-r}},$$

where $$\beta(m, n) = \int_0^1 \varphi^{m-1}(1-\varphi)^{n-1}\,d\varphi.$$

Using a straightforward transformation of random variables, we show that the PDF of $A_{1r}$ under $H_0$ follows a beta distribution given by $$f_{\Lambda_{1r}}(y)=(M-r-1)(1-y)^{M-r-2}.$$

The probability of false alarm is given by $$P_{fa}=P(\Lambda_{1r}>\lambda_{1r}|H_0)=(1-\lambda_{1r})^{M-r-1}.$$

Observe that the false alarm probability is independent of the nuisance parameters s and $\sigma^2$. Instead, it depends only on M and r, which are functions of system parameters such as the number of array elements, number of pulses in a CPI and the slope of the clutter ridge. Thus, a low rank approximation of $R^{-1}{}_d$ results in CFAR for the LRNMF test.

We then proceed to calculate the probability of detection for the test of (6). Under $H_1$, the PDF of $\epsilon_2$ remains unchanged. However under $H_1$, $X_0$ is a complex Gaussian random variable distributed as CN($a\sqrt{e^H{}_1e_1}$, $\sigma^2$). Consequently, $\epsilon_1$ is a non-central chi-squared distributed random variable with one complex degrees-of-freedom having non-centrality parameter $A=|a|\sqrt{e^H{}_1e_1}/\sigma$. Noting that $|a|^2e^H{}_1e_1$ is the signal energy in the sub-dominant disturbance is simply subspace it follows that $A^2=|a|^2e^H{}_1e_1/\sigma^2$ is simply the SNR arising in the sub-dominant disturbance subspace. Thus, the non-centrality parameter is related to the SNR in a straightforward manner. Hence, $\phi$ has a non-central F distribution in this instance. Again using a straightforward transformation of random variables, it follows that $A_{lr}$, follows a non-central beta PDF given by $$f_{\Lambda_{lr}}(y) - \sum_{k=0}^{\infty}\exp(-A^2)\frac{A^{2k}y^k(1-y)^{M-r-2}}{k!\beta(M-r-1, k+1)},$$

$$0 \leqslant y \leqslant 1.$$

The probability of detection is given by $$P_d = P(\Lambda_{lr} > \lambda_{lr} \mid H_1)$$
$$= 1 - E,$$

$$E = (1-\lambda_{lr})^{M-r-1}\sum_{k=1}^{M-r-1}\frac{\Gamma(M-r)}{\Gamma(k+1)\Gamma(M-r-k)}F,$$

-continued $$F = \left(\frac{\lambda_{lr}}{1-\lambda_{lr}}\right)^k \times [1 - gammainc(A^2(1-\lambda_{lr}), k+1)],$$

where $\Gamma(\cdot)$ is the Eulero-Gamma function and $$gammainc(\theta, M) = \frac{1}{\Gamma(M)}\int_0^{\theta} z^{M-1}\exp(-z)\,dz.$$

It is important to note that $P_d$ depends on $\sigma^2$ only through $A^2$ (SNR) and not on nuisance parameters such as exact signal shape, signal complex amplitude or exact noise variance. FIG. 2 shows a plot of the false alarm probability versus threshold for the LRNMF test with the clutter rank r as a parameter. We observe a significant increase in the threshold with increasing clutter rank for a given Pfa value. A plot of Pd versus SNR for the LRNMF test with r as a parameter is shown in FIG. 2. Relevant test parameters are reported in the plot. We note that a 1:32 dB loss in detection performance is encountered as the rank varies from r=4 to 55. FIG. 3 presents a comparison of the performance for the LRNMF with r=4 and 55 with the full rank NMF for the case where the disturbance consists of white noise alone with a full rank covariance matrix and no clutter. Relevant test parameters are reported in the plot. For completeness, we reproduce below the analytical expressions for the false alarm and detection probabilities of the full rank NMF. Specifically, $$P_{fa-NMF} = P(\Lambda_{NMF} > \lambda_{NMF} \mid H_0) = (1-\lambda_{NMF})^{M-1}$$

$$P_{d-NMF} = 1 - (1-\lambda_{NMF})^{M-1}G,$$

$$G = \sum_{k=1}^{M-1}\frac{\Gamma(M)}{\Gamma(k+1)\Gamma(M-k)}H,$$

$$H = \left(\frac{\lambda_{NMF}}{1-\lambda_{NMF}}\right)^k \times [1 - gammainc(A_1^2(1-\lambda_{NMF}), k+1)],$$

$$A_1^2 = \frac{|a|^2 e^H e}{\sigma^2},$$

where $A^2$ is the full rank NMF output SNR. The curves in FIG. 3 reveal important features of the low rank approximation to the covariance matrix. Curve 1 corresponding to r=0 (no clutter) upper bounds the performance of the low-rank approximation. Furthermore, for the clutter rank r=4 of the LRNMF test attains performance close to its upper bound, i.e., the full rank(M×M covariance matrix) NMF test performance in background white noise with unknown power level. This is due to the fact that the for $P_{fa}=10^{-6}$, $\lambda_{NMF}$= 0:1969, while $\lambda_{1r}$=0:2088 (a slight threshold increase). Furthermore, for r=4, $A^2 \sim A^2_1$ (negligible SNR loss). For instance, if e=(1/√M)[1 1 . . . 1] and P is a rank four projection matrix, $A^2$=0:9375$A^2_1$. Hence, the LRNMF for r=4 attains performance close to the upper bound (indistinguishable from the upper bound performance in FIG. 3).

As the clutter rank increases, performance of the LRNMF degrades. The performance degradation (approximately 4 dB loss) with increasing rank (from r=4 to 55) can be accounted for due to the fact that the threshold incurs an increase with increasing clutter rank. Furthermore, $A^2$, which is a measure of the output SNR, is also decreased with increasing clutter rank. Since $P_d$ is a monotonic function of $A^2$, performance is degraded with increasing r.

This is expected since the full rank NMF test for r=0 is invariant to the unknown white noise level. However, addition of clutter results in the loss of gain invariance in general. Nevertheless, imposing a low rank structure approximation of the clutter covariance matrix restores the gain invariance for small values of clutter rank. When the clutter rank follows the Brennan's rule (r=33), we note that there is a slight detection loss of the LRNMF compared to the full rank NMF test with r=0. However, the LRNMF test still retains the advantage of not requiring knowledge of s and $\sigma^2$.

In this discussion, we present the performance analysis of an adaptive version of the LRNMF test of (6). The disturbance covariance matrix is seldom known in practice and thus must be estimated using representative training data. Specifically, we consider the LRNMF test of (6) with P replaced by its estimate ˆP formed from a singular value decomposition (SVD) of a data matrix Z whose columns $z_i$, i=1, 2, . . . , K contain representative training data. The resulting test is called the LRNAMF. It can be readily demonstrated using arguments similar to those employed for the LRNMF test that the LRNAMF offers invariance to the unknown clutter power as well as the background noise power for large clutter-to-noise ratio (CNR), i.e., $s\lambda_1 > \sigma^2$. In radar applications this condition is satisfied in most instances. For example, the MCARM and KASSPER data sets offer an average CNR of 40 dB.

Typically r is unknown in practice. Consequently, a key issue in this context is the determination of r from the training data. Several techniques for determining r are available in the literature. The method of is best suited for our analysis since it does not require explicit knowledge of $\sigma^2$. Furthermore, the method has been successfully applied to radar data from the multichannel airborne radar measurement (MCARM) and research laboratory space-time adaptive processing (RLSTAP) programs.

TABLE 1

KASSPER data parameters

| Parameters | Value |
|---|---|
| Carrier frequency (MHz) | 1240 |
| Bandwidth (MHz) | 10 |
| Number of antenna elements | 11 |
| Number of pulses | 32 |
| Pulse repetition frequency (Hz) | 1984 |
| 1000 range bins (km) | 35-50 |
| 91 azimuth angles (deg) | 87, 89, . . . , 267 |
| 128 Doppler frequencies (Hz) | −992 to 992 |
| Clutter power (dB) | 40 |
| Platform speed (m/s) | 100 |
| Target speed (m/s) | 26.8 |
| Number of targets | 226 |
| Target Doppler frequency range (Hz) | −99.2 to 372 |

TABLE 2

RLSTAP data parameters

| | |
|---|---|
| J | 14 |
| N | 8 |
| K | 80 |
| Number of jammers | 2 |
| Jammer angles (deg) | 50, 80 |
| Jammer powers (dB) | 30, 30 |
| Clutter power (dB) | 45 |
| Clutter power error (dB) | 10 |
| y | 2.32 |
| Signal Doppler (deg) | 171 |
| Signal spatial angle off-boresight (deg) | 0 |
| Antenna boresight angle (deg) | 315 |

Data from the L-band data set of the KASSPER program is used for carrying out performance analysis of the LRNAMF. The L-band data set consists of a datacube of 1000 range bins corresponding to the returns from a single coherent processing interval (CPI) from 11 channels and 32 pulses resulting in a spatio-temporal product of 352. Relevant system parameters for the L-band data sets from the KASSPER and RLSTAP programs are provided in Tables 1 and 2, respectively. Since analytical expressions for $P_d$ and $P_{fa}$ for the LRNAMF are mathematically intractable, we resort to performance evaluation using Monte Carlo simulation.

FIG. 4 shows the eigenspectrum of the KASSPER data. This plot is obtained from an SVD of the KASSPER datacube. Relevant test parameters are reported in the plot. We observe that the eigenspectrum exhibits a significant roll off (nearly 60 dB) after approximately 50 eigenvalues. The rank of the clutter subspace is determined using the procedure outlined. The procedure yields a clutter rank of 42 for this example, which is in agreement with the Brennan rule (3).

FIG. 5 shows the variation of the LRNAMF $P_{fa}$ as a function of normalized Doppler beam position for a fixed steering angle. Relevant test parameters are reported in the plot. For ease of simulation, we present the results for the case of two channels and 32 pulses. The curve which reflects a constant false alarm probability as a function of Doppler corresponds to the LRNMF and is obtained using (14). A large increase of the LRNAMF threshold in the vicinity of zero Doppler is observed resulting in increased false alarm probability. Also the LRNAMF threshold decreases with increasing K, the sample support used in forming $\hat{P}$. Hence, $P_{fa}$ has less variability with increasing sample support. A modest CFAR loss is incurred with respect to the normalized Doppler beam position (particularly in the vicinity of zero Doppler). Our simulations also reveal that the threshold is insensitive to the unknown clutter power level and noise variance as long as the CNR is high. Invariance breaks down when the CNR attains a threshold value in accordance with the results of.

FIG. 6 presents a similar result for the threshold variation as a function of angle with a fixed Doppler. These plots correspond to range bins 200 and 800, respectively. The true covariance matrix corresponding to these two range bins is used to generate data for the Monte Carlo simulations. Relevant test parameters are reported in the plots. A slight variation of the threshold as a function of angle is seen in both cases. However, this has minimal impact on the false alarm probability. Therefore, the LRNAMF offers CFAR like behavior with respect to normalized angular beam position.

FIG. 8 shows a plot of the LRNAMF $P_d$ as a function of signal-to-interference-plus-noise ratio (SINR). Relevant test parameters are reported in the plot. The analytical curve corresponding to the LRNMF represents the upper bound on performance of the LRNAMF. With K=2r training data samples for estimating $\hat{P}$, we observe a 4 dB decrease in performance with respect to the analytical curve. The performance loss is reduced with increasing K. Specifically, for 3 dB detection ($P_d$) performance K=5r training data vectors are needed. We noted that 3 dB performance in terms of SNR requires the use of K=2M target-free training data vectors. It was shown that 3 dB performance for $P_d$ using sample matrix inversion calls for K=5M training data vectors. This is due to the fact that although $P_d$ is a monotonic function of SNR, it is a highly nonlinear function. Consequently, the training data support needed for 3 dB SNR performance is quite different from the 3 dB performance for $P_d$. The work of [19,20] derives an expression for the PDF of the output SNR of the principal components inverse technique and shows that the training data support for 3 dB performance is K=2r. A similar result is also noted while considering the low rank problem in a maximum likelihood estimation framework and in while dealing with eigenprojection methods. FIG. 8 reports for the first time the corresponding training data support for 3 dB performance in terms of $P_d$ for low rank adaptive processing methods. This result is very similar in spirit to that reported in for the sample matrix inversion technique.

In FIG. 9, we present an example where the rank of the clutter subspace is incorrectly estimated. Specifically, we consider the case where r has been underestimated and show a plot of $P_d$ versus SINR. The predicted r from the Brennan rule is 42, whereas the estimated rank is 33. The error in estimating r is caused due to the use of an ad hoc procedure for determining r instead of the method of prior art. The specific method used in determining r is based on calculating the ratio of the sum of the squared magnitude of the dominant singular values and the sum of the squared magnitude of all the singular values arising significantly outperform the SCRFML/GIP and FML methods; i.e., the two targets are clearly observable from the output residue (about 22 dB above the APR associated with the target free range cells). The latter two methods show poor but similar performance in all cases. The SCRFML/APR method is most useful in instances where detection and training have to be performed on a common data set. While no optimality property of the approach is claimed, the ad hoc SCRFML/APR method offers a powerful tool for removing outliers in training data.

This invention presents an analysis of the NMF test for the case of clutter plus white noise. Imposing a low rank structure on the known clutter covariance matrix enables approximate CFAR behavior yielding robustness with respect to unknown clutter scaling and unknown background noise level. Analytical expressions for the detection and false alarm probabilities are presented and illustrated with numerical examples in the form of plots $P_d$ versus SNR. We observe a degradation in performance as the clutter rank increases. This loss (approximately 4 dB) is quite significant at low false alarm rates.

Performance of the LRNAMF, an adaptive version of the LRNMF is studied using the KASSPER radar data. We observe a 4 dB degradation in performance due to the finite sample support used in estimating the clutter subspace. Furthermore, we note a loss of CFAR for the LRNAMF due to the threshold dependence on the Doppler beam position. An important feature of the LRNAMF is the ability to reduce the training support for subspace estimation. Finally, we note that accurate determination of the rank of the clutter subspace significantly impacts detection performance. Critical to the performance of the LRNAMF is the ability to obtain representative training data. However, in dense target environments, significant performance penalty is incurred due to target contamination of the training data. This results in signal cancellation causing a degradation in the SNR. Consequently, the SCRFML/APR method presented here is useful for rejecting outliers in the training data and obtaining good estimates of the projection matrix. Further performance analysis using this technique with the LRNAMF will be investigated in the future. An important issue in this context is the development of a suitable stopping criterion for the SCRFML/APR method.

Additionally, finite sample support used in clutter subspace estimation causes subspace perturbation and subspace swapping. The impact of these effects on LRNAMF performance is currently under investigation. These issues will be reported on in the future.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A radar target detection process for producing a target detection signal from a radar data stream received from a heterogeneous clutter environment with clutter and interference using a signal vector with radar target detection process producing a detection signal for hypothesis $H_0$, when the signal of interest is not present in the observed data signal and $H_1$ when the signal of interest is present in the observed data signal, said radar target detection process comprising the steps of:

forming an estimate of a covariance matrix of the clutter and interference in the heterogeneous clutter environment;

a first subtracting step that comprises subtracting the signal vector from the observed data signal from the host system to produce thereby a first subtraction signal;

estimating the signal of interest from the observed data signal to produce an estimate signal;

a first step which uses a first linear prediction error filter which processes the first subtraction signal and the estimate signal to produce thereby an output signal;

a second step which uses a second linear prediction error filter which processes the observed data signal from the host system with the estimate signal to produce an output signal;

a transforming step that comprises transforming the output signal of the first linear prediction error filter using a first ZMNL tansformation unit;

a second transforming step that comprises transforming the output of the second linear prediction error filter using a second ZMNL transformation unit a second subtracting step that comprises subtracting the second ZMNL transformed signal from the first ZMNL transformed signal to produce thereby a second subtraction signal; and generating threshold signals from the second subtraction signal to produce thereby said detection signal for said host system.

2. A radar target detection process as described in claim 1, wherein said estimating step comprises using a data processor to obtain a signal amplitude estimate using $$\hat{a} = \frac{\tilde{s}_0^{\,H}\hat{\Sigma}^{-1}X}{\tilde{s}_0^{\,H}\hat{\Sigma}^{-1}\tilde{s}_0}$$

where $$\tilde{s}_0$$

is a steering vector of the host system and $\hat{\Sigma}^{-1}$ is an inverse of an estimated data covariance matrix, and X is the observed data signal received by said host system.

3. A radar target detection process as described in claim 2, wherein said first and second using steps each comprise producing output signals using Kalman filters as said first and second linear prediction error filters.

4. A radar target detection process, as described in claim 3, wherein said first and second transforming steps each respectively comprise taking In on where h.sub.2JN (q) represents the output signals of the first and second linear prediction error filters.

5. A radar target detection process, as described in claim 4, wherein said generating step comprises using a data processor to calculate $$q_x\Big|H_i = \sum_{j=1}^{J}\sum_{k=1}^{N}\frac{[\hat{\Gamma}(k \mid H_i)]^2}{\sigma_{jk}^2(k \mid H_i)} = q_\Gamma\Big|H_i i = 0$$

where $H_0$ denotes the condition where no signal of interest is present in the observed data signal and $H_1$ denotes that the signal of interest is present in the observed data signals received by the host system and wherein G.sub.j.sup.2 (k) is the associated estimated variances of the error signals.

* * * * *